(12) United States Patent
Li et al.

(10) Patent No.: US 12,334,888 B2
(45) Date of Patent: Jun. 17, 2025

(54) SYSTEM AND METHOD FOR MULTI-BAND LIMITER WITH MULTIPLE FREQUENCY RANGE

(71) Applicant: Harman International Industries, Incorporated, Stamford, CT (US)

(72) Inventors: Dong Cheng Li, Ji'an (CN); James Zheng, Shenzhen (CN)

(73) Assignee: Harman International Industries, Incorporated, Stamford, CT (US)

( * ) Notice: Subject to any disclaimer, the term of this patent is extended or adjusted under 35 U.S.C. 154(b) by 122 days.

(21) Appl. No.: 18/202,664

(22) Filed: May 26, 2023

(65) Prior Publication Data

US 2024/0396514 A1    Nov. 28, 2024

(51) Int. Cl.
*H03G 11/04* (2006.01)
*H04R 3/04* (2006.01)

(52) U.S. Cl.
CPC ............ *H03G 11/04* (2013.01); *H04R 3/04* (2013.01); *H04R 2430/01* (2013.01)

(58) Field of Classification Search
CPC ........ H03G 11/04; H03G 5/165; H03G 9/005; H03G 9/025; H03G 5/00; H04R 3/04; H04R 2430/01; H04R 3/007; H04R 2430/03; H04R 3/14
USPC ..................... 381/98, 99, 103, 106
See application file for complete search history.

(56) References Cited

U.S. PATENT DOCUMENTS

| | | | | |
|---|---|---|---|---|
| 4,641,361 A | * | 2/1987 | Rosback | H03G 11/02 381/103 |
| 5,278,912 A | | 1/1994 | Waldhauer | |
| 5,500,902 A | * | 3/1996 | Stockham, Jr. | H04R 25/356 381/106 |
| 9,225,310 B1 | * | 12/2015 | Lukin | H03G 9/005 |
| 9,385,679 B1 | | 7/2016 | Polleros | |
| 9,960,744 B1 | * | 5/2018 | Lee | G10L 19/008 |
| 9,966,921 B2 | * | 5/2018 | Shimada | H03G 9/005 |
| 10,104,473 B2 | * | 10/2018 | Bjork | H04R 3/08 |
| 10,123,118 B2 | * | 11/2018 | Ramos | H04R 3/14 |
| 10,755,722 B2 | | 8/2020 | You | |
| 10,985,716 B2 | * | 4/2021 | Goto | H03F 3/185 |
| 11,012,775 B2 | * | 5/2021 | Vautin | H04R 3/007 |

(Continued)

OTHER PUBLICATIONS

European Search Report dated Feb. 6, 2025 for European Patent Application No. 24174286.5 filed May 6, 2024, 13 pgs.

*Primary Examiner* — Xu Mei
(74) *Attorney, Agent, or Firm* — Brooks Kushman P.C.

(57) ABSTRACT

In at least one embodiment, an audio limiter system is provided. The system includes a first limiter block, a second limiter block, and a third limiter block. The first limiter block receives an incoming audio signal having a plurality of first frequencies and limits the incoming audio signal with the plurality of first frequencies based on at least a first gain threshold to generate at least a first high audio output signal. The second limiter block receives the incoming audio signal having a plurality of second frequencies and limits the incoming audio signal with the plurality of second frequencies based on at least a second gain threshold to generate at least a first low audio output signal. The third limiter block receives the first high audio output signal and/or the first low audio output signal and limits the first high audio output signal and/or the first low audio output signal.

20 Claims, 6 Drawing Sheets

(56) References Cited

U.S. PATENT DOCUMENTS

| | | | |
|---|---|---|---|
| 11,616,482 B2* | 3/2023 | Port | H03G 9/005 |
| | | | 381/106 |
| 2004/0081324 A1* | 4/2004 | Lau | H03G 7/002 |
| | | | 381/94.5 |
| 2017/0111020 A1 | 4/2017 | Song et al. | |
| 2019/0065138 A1* | 2/2019 | Ryckman | H03G 9/005 |
| 2024/0314486 A1* | 9/2024 | D'Agostino | H04R 1/1083 |

* cited by examiner

|  | Low-Band | High-Band | Full-Band |
|---|---|---|---|
| Crossover Freq [Hz] | | 300 | |
| Threshold [dB] | -26 | -26 | -18 |
| AT [ms] | 10 | 10 | 10 |
| RT [ms] | 1000 | 1000 | 1000 |

*Fig-7*

SYSTEM AND METHOD FOR MULTI-BAND LIMITER WITH MULTIPLE FREQUENCY RANGE

TECHNICAL FIELD

Aspects disclosed herein generally relate to a system and a method for a multi-band limiter with a multiple frequency range. These aspects and others will be discussed in more detail below.

BACKGROUND

A compressor or limiter is generally utilized for dynamic range control processing which may be used in a Bluetooth® speaker product. There are various justifications for utilizing the compressor to perform digital signal processing for a loudspeaker. In one example, the limiter may protect an audio amplifier and the loudspeaker in avoiding damage in response to a high-level signal input. In another example, the limiter may boost bass performance at a mid-low volume level by compressing a dynamic range of a low frequency band. In yet another example, the limiter may reduce speaker or amplifier distortion at a high-volume level. Due to various characteristics of an audio signal (e.g., a music signal), the manner in which the limiter type and the corresponding parameters for the limiter influence the audio performance and sound timbre of the loudspeaker may vary at a high-volume level. The characteristics of an audio signal may include (i) an amplitude of the audio signal that varies relative to time in a time domain, (ii) multiple frequency components that are mixed together at the same time, and (iii) high, mid, and low frequency power and low, mid, and high frequency power.

SUMMARY

In at least one embodiment, an audio limiter system is provided. The system includes a first limiter block, a second limiter block, a third limiter block, and an adder circuit. The first limiter block is programmed to receive an incoming audio signal having a plurality of first frequencies and to limit the incoming audio signal with the plurality of first frequencies based on at least a first gain threshold to generate at least a first high audio output signal. The second limiter block is programmed to receive the incoming audio signal having a plurality of second frequencies and to limit the incoming audio signal with the plurality of second frequencies based on at least a second gain threshold to generate at least a first low audio output signal. The third limiter block is programmed to receive at least one of the first high audio output signal and the first low audio output signal and to limit the at least one of the first high audio output signal and the first low audio output signal based at least on a total gain threshold to generate a modified low audio output signal. The adder circuit is programmed to combine the modified low audio output signal to the first high audio output signal to generate a final output audio signal that exhibits reduced distortion during audio playback based at least on the first gain threshold, the second gain threshold, and the total gain threshold.

In at least another embodiment, a method for limiting an audio signal is provided. The method includes receiving, at a first limiter block, an incoming audio signal having a plurality of first frequencies and limiting the incoming audio signal with the plurality of first frequencies based on at least a first gain threshold to generate at least a first high audio output signal. The method further includes receiving, at a second limiter block, the incoming audio signal having a plurality of second frequencies and limiting the incoming audio signal with the plurality of second frequencies based on at least a second gain threshold to generate at least a first low audio output signal. The method further includes receiving, at a third limiter block, at least one of the first high audio output signal and the first low audio output signal and limiting the at least one of the first high audio output signal and the first low audio output signal based at least on a total gain threshold to generate a modified low audio output signal. The method further includes combining the modified low audio output signal to the first high audio output signal to generate a final output audio signal that exhibits reduced distortion during audio playback based at least on the first gain threshold, the second gain threshold, and the total gain threshold.

In at least another embodiment, a computer-program product embodied in a non-transitory computer readable medium stored in memory and executable by at least one controller to limit an audio signal is provided. The computer-program product includes instructions for receiving, at a first limiter block, an incoming audio signal having a plurality of first frequencies and for limiting the incoming audio signal with the plurality of first frequencies based on at least a first gain threshold to generate at least a first high audio output signal. The computer-program product includes instructions for receiving, at a second limiter block, the incoming audio signal having a plurality of second frequencies and for limiting the incoming audio signal with the plurality of second frequencies based on at least a second gain threshold to generate at least a first low audio output signal. The computer-program product includes instructions for receiving, at a third limiter block, at least one of the first high audio output signal and the first low audio output signal and for limiting the at least one of the first high audio output signal and the first low audio output signal based at least on a total gain threshold to generate a modified low audio output signal. The computer-program product includes instructions for combining the modified low audio output signal to the first high audio output signal to generate a final output audio signal that exhibits reduced distortion during audio playback based at least on the first gain threshold, the second gain threshold, and the total gain threshold.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

FIG. 7 depicts a tuning process of the limiter in accordance with one embodiment.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The foregoing disclosure may resolve issues related to a common portable loudspeaker's power limitations and also resolve various operating characteristics of limiters that limit an incoming audio signal. For example, to improve a dual-band limiter and to further optimize performance for a loudspeaker, the embodiments provided herein may utilize a new limiter (or compressor architecture), while considering the incoming audio (or music) signal and loudspeaker characteristics. The disclosed limiter(s) may be implemented, for example, in a portable loudspeaker system. The disclosed embodiments may provide the noted advantages by (i) compressing an audio input signal (or incoming audio signal) in a different frequency band than that used by a common multi-band limiter, (ii) comparing a sum of a total energy (e.g., low and high frequency components) for each band with a predefined threshold by an additional limiter, (iii) compressing a signal of a low frequency band via an additional limiter (e.g., this condition may aid in reducing loudspeaker distortion), and (iv) further boosting the bass or maximum loudness automatically depending on the audio input signal with appropriate parameter tuning.

The disclosed embodiments may reduce loudspeaker distortion at high volume levels. In addition, the disclose limiter(s) may also allow acoustic engineers to balance distortion, loudness, and bass performance more flexibly and obtain optimal performance. In general, many loudspeaker products may not be able to reproduce enough bass, as such products may be limited by a small driver size. To improve the bass performance at mid-low volume levels, it is possible to apply equalizations on a low-frequency band for the limiter. However, this condition boosts the input signal to trigger the limiter constantly at a high-volume level. In this case, the high-frequency band output signal of the loudspeaker varies along with the low-frequency band signal. Since human ears are more sensitive to high frequency than low frequency, listeners can easily perceive this sound variation, and this provides an annoying and unnatural sound for the listeners. Moreover, if the low frequency band is boosted higher, this condition yields a more unnatural sound for listeners.

Figure 1:
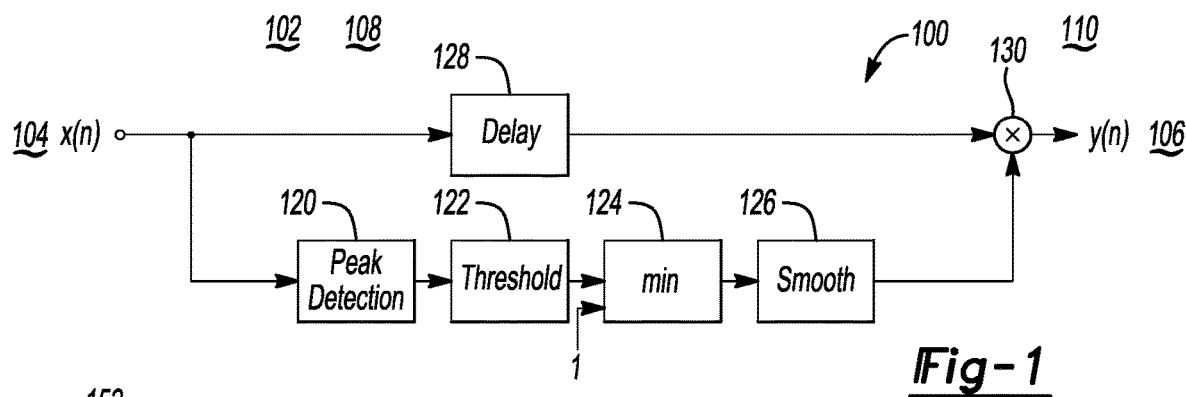
FIG. 1 depicts one example of a single-band limiter.

FIG. 1 depicts one example of a single-band limiter 100. The limiter 100 may be part of an audio system 102 that includes an audio source 104 and one or more loudspeakers 106. At least one controller 108 ("the controller 108") may execute the limiter 100 to limit the magnitude of an incoming audio signal, x(n) to prevent an amplifier 110 and the loudspeakers 106 from being damaged. The limiter 100 includes a peak detection block 120, a threshold block 122, a minimum block 124, and a smooth block 126, a delay block 128, and a multiplier circuit 130. The peak detection block 120 detects a peak associated with the incoming audio signal. In general, the peak detection block 120 detects a gain parameter (or gain) associated with the incoming audio signal. For example, the peak detection block 120 detects a peak magnitude of an incoming audio signal (or audio input signal) in a time frame. The peak magnitude of the incoming audio signal may vary over time based on the volume of the incoming audio signal (e.g., peak magnitude may be 0.1 or greater and so on for corresponding time frames, $t_1$-$t_n$ The threshold block 122 compares the peak magnitude of the incoming audio signal as provided by the peak detection block 120 to a predetermined limiter threshold. The predetermined limiter threshold may correspond to any value such as, for example, 0.1 or 1, etc. If the peak magnitude of the incoming audio signal as output by the peak detection block 120 is less than the predetermined limiter threshold, then the threshold block 122 outputs a predetermined value (e.g., 0) which entails that no additional processing may be performed by the limiter 100. If the peak magnitude of the incoming audio signal as output by the peak detection block 120 is greater than the predetermined limiter threshold, then the threshold block 122 outputs a value that corresponds to the predetermined limiter threshold. Thus, assuming for the sake of example that the predetermined limiter threshold is 0.1, then the threshold block 122 outputs the value of 0.1. The minimum block 124 compares the output of the threshold block 122 to a predetermined constant value which may also be, for example, one. The minimum block 124 takes the minimum value of: (i) the output from the threshold block 122, and (ii) the predetermined constant value and outputs the same.

The smooth block 126 applies a smoothing function to the output of the minimum block 124 to smooth the gain of the incoming audio signal dramatically to reduce pops or noise on the incoming audio signal over corresponding time frames. The delay block 128 delays the incoming audio signal and the multiplier circuit 130 multiplies the gain of the smoothed output signal to the incoming audio signal to generate an output audio signal, y(n). The delay block 128 may delay the incoming audio signal to ensure that the output from the smoothing block 126 may be applied to the incoming audio signal in advance. In this case, the limiter 100 may quickly react on the larger incoming audio signal and easily control the distortion. The multiplier circuit 130 transmits the output audio signal to the loudspeaker 106 to provide an audio signal in a listening environment. The limiter 100 as described above may provide the condition in which the audio input signal may trigger the limiter constantly at a high-volume level and/or a high frequency band output signal as provided by the loudspeaker 106 varies along the low-frequency band signal thus causing an annoying and unnatural sound for the listener. In general, the single-band limiter 100 may exhibit low timbre stability and low bass performance at low volume. In addition, the single-band limiter 100 may exhibit high loudness and easy distortion control.

Figure 2:
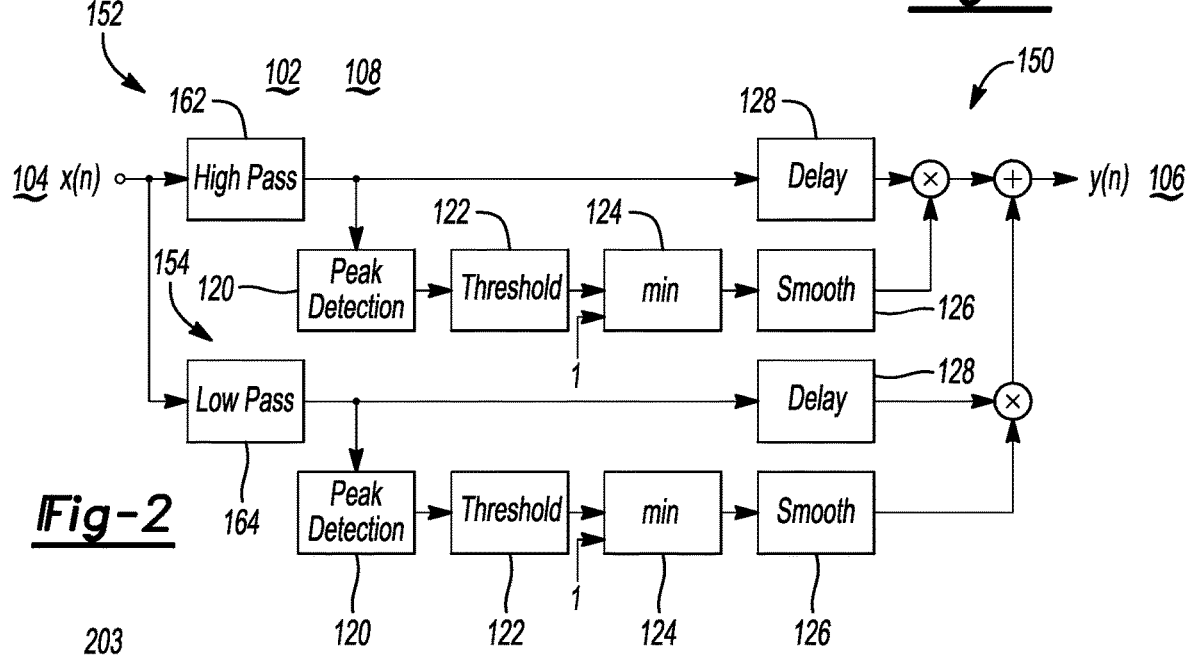
FIG. 2 depicts one example of a dual-band limiter.

FIG. 2 depicts one example of a dual-band limiter 150 (or audio limiter system 150). The dual-band limiter 150 may overcome some of the deficiencies of the single band limiter 100 as set forth in FIG. 1. The dual band limiter 150 includes a first band 152 and a second band 154. The first band 152 includes the peak detection block 120, the threshold block 122, the minimum block 124, the smooth block 126, the delay block 128, and the multiplier circuit 130, and the first filter 162 (e.g., high-pass filter). The second band 154 includes the peak detection block 120, the threshold block 122, the minimum block 124, the smooth block 126, the delay block 128, the multiplier circuit 130, and a second filter 164 (e.g., low-pass filter). The dual-band limiter 150 may overcome some of the deficiencies of the single band limiter 100 as set forth in FIG. 1. The dual band limiter 150 estimates and compresses signal power in a low and high frequency band separately. This aspect may be realized given the implementation of the high-pass filter 162 which enables frequencies above a certain cutoff frequency and the low-pass filter 164 which enables frequencies below a certain cutoff frequency. The operation for each of the first band 152 and the second band 154 is similar to that performed by the limiter 100. The dual band limiter 150 may avoid the condition in which the human-sensitive high frequency signal varies dramatically due to the extremely boosted low frequency band signal. In this case, not only is the loudspeaker 106 still able to reproduce considerable bass at mid-low volume level, but also the high frequency signal does not vary along with the amount of the low frequency power at a high-volume level.

However, there may be some drawbacks with the dual-band limiter 150. For example, since the low and high frequency band signals are compressed separately, these signals are mixed and fed to the amplifier 110 and the loudspeaker 106 after compression. However, the amplifier 110 and the loudspeaker 106 have an upper limit of input power, and the limit of the loudspeaker 106 is usually higher than that of the amplifier 110 in a portable speaker. If the loudspeaker 106 and the amplifier 110 are not required to generate distortion, the total required power of low and high frequency band needs to be smaller than the maximum power of the amplifier 110. On the other hand, the amplitude of the music signal varies along time, and it is relatively low most of the time. In this case, the maximum loudness of the loudspeaker 106 may be limited since the power of the amplifier 110 is not fully used. Therefore, the total required power of the low and high frequency band is usually greater than the maximum power of the amplifier 110 for higher loudness. However, the overshooting power may be uncontrollable and depends on the music signal. Therefore, the total required power needs to be set manually to balance loudness, distortion and sound timbre. The dual-band limiter 150 may exhibit good timbre stability and good bass performance at low volume. The dual-band limiter 150 may exhibit low loudness and hard distortion control.

In general, when a limiter is processed in a small loudspeaker with a limited power amplifier, it may be difficult to obtain high loudness performance and reduce any distortion as well. With the disclosed limiters as set forth below, a multi-band limiter having processing with multiple-frequency-range joint control can reproduce higher loudness and reduce distortion when compared to conventional dual-band limiters. In addition, the disclosed limiter may be more flexible to balance bass, loudness and distortion during the tuning process. The disclosed architecture of the limiter may jointly control the multi-frequency band by analyzing the signal energy of different frequency bands, and accordingly, adjust each limiter threshold automatically. Unlike the conventional multi-band limiter that compresses each frequency band independently, the disclosed limiter provides a more flexible and reasonable way to distribute output sound energy.

Figure 3:
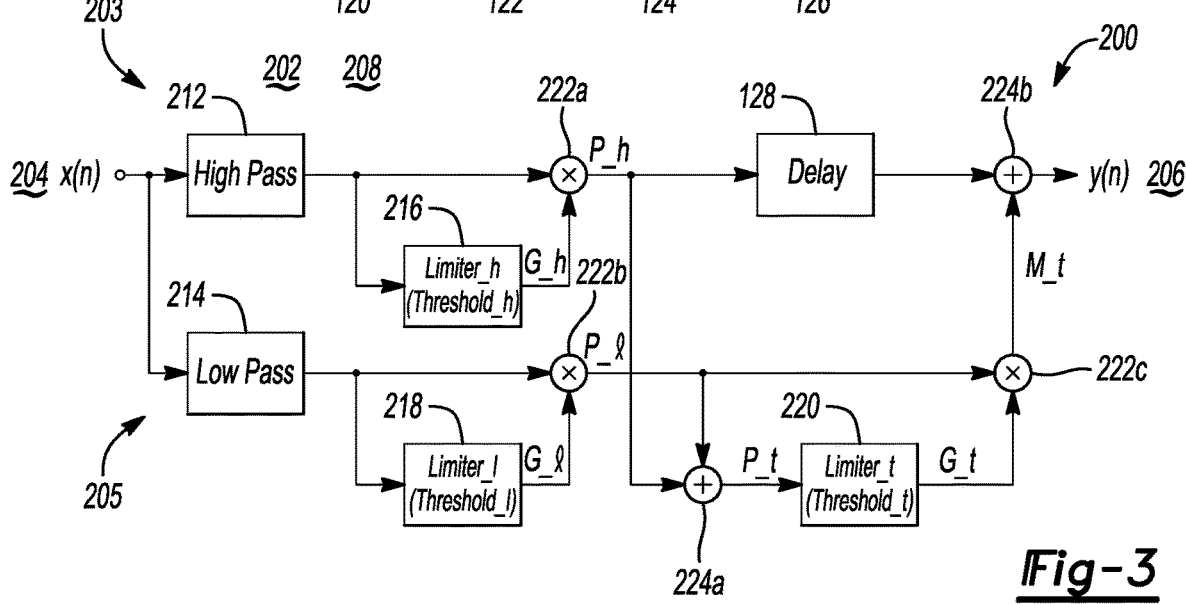
FIG. 3 depicts a limiter in accordance with one embodiment.

FIG. 3 depicts a limiter (or audio limiter system (or system)) 200 in accordance with one embodiment. The limiter 200 may also be part of an audio system that includes an amplifier 202, an audio source 204 and one or more loudspeakers 206. At least one controller 208 ("the controller 208") may execute the limiter 200 to limit the magnitude of an incoming audio signal, x(n) to prevent an amplifier 202 and the loudspeakers 206 from being damaged. The limiter 200 includes a first filter 212 (e.g., high pass filter), a second filter 214 (e.g., low pass filter), a first limiter threshold block (or first limiter block) 216, a second limiter threshold block (or second limiter block) 218, and a third limiter threshold block (or third limiter block) 220. The limiter 200 also includes a plurality of multiplier circuits 222a-222c and a plurality of adder circuits 224a-224b. The limiter 200 generally includes a high frequency side limiter 203 and a low frequency side limiter 205. The high frequency side limiter 203 generally includes the first filter 212, the first limiter threshold block 216, the multiplier circuit 222a, and a delay block 128. The delay block 128 performs a time buffering operation. Thus, all signals that are provided to the delay block 128 may be delayed with a pre-defined time parameter. The low frequency side limiter 205 generally includes the second filter 214, the second limiter threshold block 218, the multiplier circuit 222b, the adder circuit 224, the third limiter threshold block 220, and the multiplier circuit 222c.

The high pass filter 212 enables frequencies that are greater than a predetermined cutoff frequency to pass to the first limiter threshold block 216 and to the multiplier circuit 222a. The first limiter threshold block 216 outputs a first gain compression output (e.g., G_h) which corresponds to, but not limited to, a gain that is equal to, or less than a high gain threshold to the multiplier circuit 222a. For example, if the gain of the incoming audio signal with the high frequency components is greater that the high gain threshold, the first limiter threshold block 216 outputs a value that is same as the high gain threshold on the first gain compression output G_h. Therefore, the high gain threshold may be considered the first gain compression output G_h. In this case, the first limiter threshold block 216 limits the gain of the incoming signal to that set by the high gain threshold. If on the other hand the gain of the incoming audio signal with the high frequency components is less than the high gain threshold, then the first limiter threshold block 216 outputs the actual gain of the incoming audio signal and there is no need to perform a limiting operation. The multiplier circuit 222a multiplies the first gain compression output G_h (e.g., which is either the high gain threshold itself or a value that less than the high gain threshold) to the filtered incoming audio signal that is passed from the high pass filter 212 to generate a first high audio output signal (e.g., P_h).

The low pass filter 214 enables frequencies that are less than the predetermined cutoff frequency to pass to the second limiter threshold block 218 and to the multiplier circuit 222b. The second limiter threshold block 218 outputs a second gain compression output (e.g., G_1) which corresponds to, but not limited to, a gain that is equal to, or less than a low gain threshold to the multiplier circuit 222a. For example, if the gain of the incoming audio signal with the low frequency components is greater that the low gain threshold, the second limiter threshold block 218 outputs a value that is same as the low gain threshold on the second gain compression output G_1. Therefore, the low gain threshold may be considered the first gain compression output G_1. In this case, the second limiter threshold block 218 limits the gain of the incoming signal to that set by the low gain threshold. If on the other hand, the gain of the incoming audio signal with the low frequency components is less than the low gain threshold, then the second limiter threshold block 218 outputs the actual gain of the incoming audio signal and there is no need to perform a limiting operation. The multiplier circuit 222b multiplies the second gain compression G_1 output to the filtered incoming audio signal that is passed from the low pass filter 214 to generate a first low audio output signal (e.g., P_1).

The adder circuit 224a receives the first high audio output signal, P_h and the first low audio output signal, P_1 and sums the two signals to provide a total audio output signal, P_t to the third limiter threshold block 220. The third limiter threshold block 220 compares the gain on the total audio output signal, P_t to a total gain threshold. If the gain of the total audio output signal, P_t is greater than the total gain threshold, then the third limiter threshold block 220 outputs a value that is same as the total gain threshold on the on a final compression gain output signal (e.g., G_t). Therefore, the total gain threshold may be considered the first compression gain output G_t. In this case, the third limiter threshold block 220 limits the gain of the total audio output signal, P_t to that of the total gain threshold. If on the other hand the gain of the total audio output signal, P_t is less than the total gain threshold, then the third limiter threshold block 220 outputs the actual gain of the total audio output signal, P_t and there is no need to perform a limiting operation. The multiplier circuit 222c multiplies the gain of the total audio signal, P_t to the first low audio output signal, P_1 to generate a modified low audio output signal M_t. In this case, it can be seen that the multiplier circuit 222c applies the final compression gain output signal, G_t only on the low frequency band of the incoming audio signal. The adder circuit 224b adds the gain, G_t to the first high audio output signal, P_h.

In general, with the limiter 200 as shown in connection with FIG. 3, it can be seen that a high frequency band on the incoming audio signal, x(n) may only be impacted based on the comparison of the gain of the high frequency band on the incoming audio signal to the high gain threshold by the first limiter threshold block 216. With respect to a mid-high frequency band on the incoming audio signal, this is generally compressed smoothly and may not be varied drastically at a high volume (e.g., unlike the low frequency band or the high frequency band).

The low frequency band of the incoming audio signal may generally be impacted based on the threshold values established for the low gain threshold at the second limiter threshold block 218, and the total threshold value at the third limiter threshold block 220. In a first condition, when the incoming audio signal is dominated by a low frequency component (e.g., the condition in which at least the gain of the low frequency band of the incoming signal is greater than the low gain threshold at the second limiter threshold block 218), this low frequency component will be compressed by the limiter 200. However, in this case, no distortion may be generated. In this case, the high frequency component may be small and the high frequency side limiter 203 may not be operational. For example, the first condition corresponds to a total energy on the incoming audio signal being almost the same as (or comprised of almost entirely) the low band (or frequency) energy. In other words, the incoming audio signal may be dominated by a low frequency component. In this case, the power of the audio input signal will not exceed the limit of the amplifier 202 after tuning is performed by an engineer. Thus, given that the power of the audio input signal does not exceed the limit of the amplifier 202, the amplifier 202 does not generate any distortion on the audio output signal. One example of the first condition may include the total energy limit of the amplifier 202 having −10 db. The low-band energy threshold for the amplifier 202 may be set as −12 db. Therefore, when low-band energy is high, however with no energy on the high-band side (or on the high frequency side limiter 203), the maximum total energy may be −12 db less than −10 db. In this case, the amplifier 202 may not generate any distortion.

In a second condition, the incoming audio signal may be dominated by a high frequency component. In this case, the low frequency component may be small and the low frequency side limiter 205 may not be operational. Again, in this case, no distortion may be generated since the total energy on the audio signal may be the same as the high band (frequency) or energy. One example of the second condition may correspond to the amplifier 202 (or limiter 200) having a total energy limit of −10 dB. The high-band energy threshold for the high frequency side limiter 203 may be set as −12 dB, when the high-band energy is high with no energy on the low band side. Therefore, the total energy for the audio input signal may be −12 dB which is less than the limit of −10 dB. In this case, the limiter 200 does not generate any distortion.

In a third condition, the incoming audio signal may include considerable amounts of low and high frequency components. In this case, the total energy may be so high that distortion may be introduced. Thus, the limiter 200 may compress each frequency band (e.g., both the high frequency side limiter 203 and the low frequency side limiter 205 may be operable to compress high frequency components and low frequency components, respectively). In general, the low frequency side limiter 205 may compress the signal (or gain) of the low frequency band on the incoming signal if the energy (or gain) is greater than the low gain threshold of the second limiter threshold block 218 and greater than the predetermined threshold value established by the third limiter threshold block 220. Due to the presence of at least the third limiter threshold block 220 under this condition, the limiter 200 may reduce distortion significantly. In other words, due to at least the high gain threshold (e.g., or first gain threshold G_h), the low gain threshold (e.g., or second gain threshold G_1), and the total gain threshold (G_t), the system 200 plays back the incoming audio signal as the output audio signal at a reduced rate of distortion.

One example of the third condition may correspond to amplifier 202 (or limiter 200) having a total (or maximum) energy limit of −10 dB. The low-band energy threshold for the low frequency side limiter 205 may be set at −12 dB and the high-band energy threshold for the high frequency side limiter 203 may also be set at −12 dB. Thus, when the energy on both the low and high band of the incoming audio signal are high, the maximum total energy may be −9 dB which is greater than the limit of maximum energy limit of −10 dB. In this case, the limiter 200 generates distortion given that the maximum energy limit has been exceeded. However, due to the presence of the third limiter threshold block 220, it is possible to compress the low-band energy to, for example, −14.3 dB so that the total energy of the incoming audio signal (e.g., the total energy of the incoming audio signal including both low and high frequency bands) is equal to the limit. In this case, the limiter 200 will refrain from generating distortion.

Figure 4:
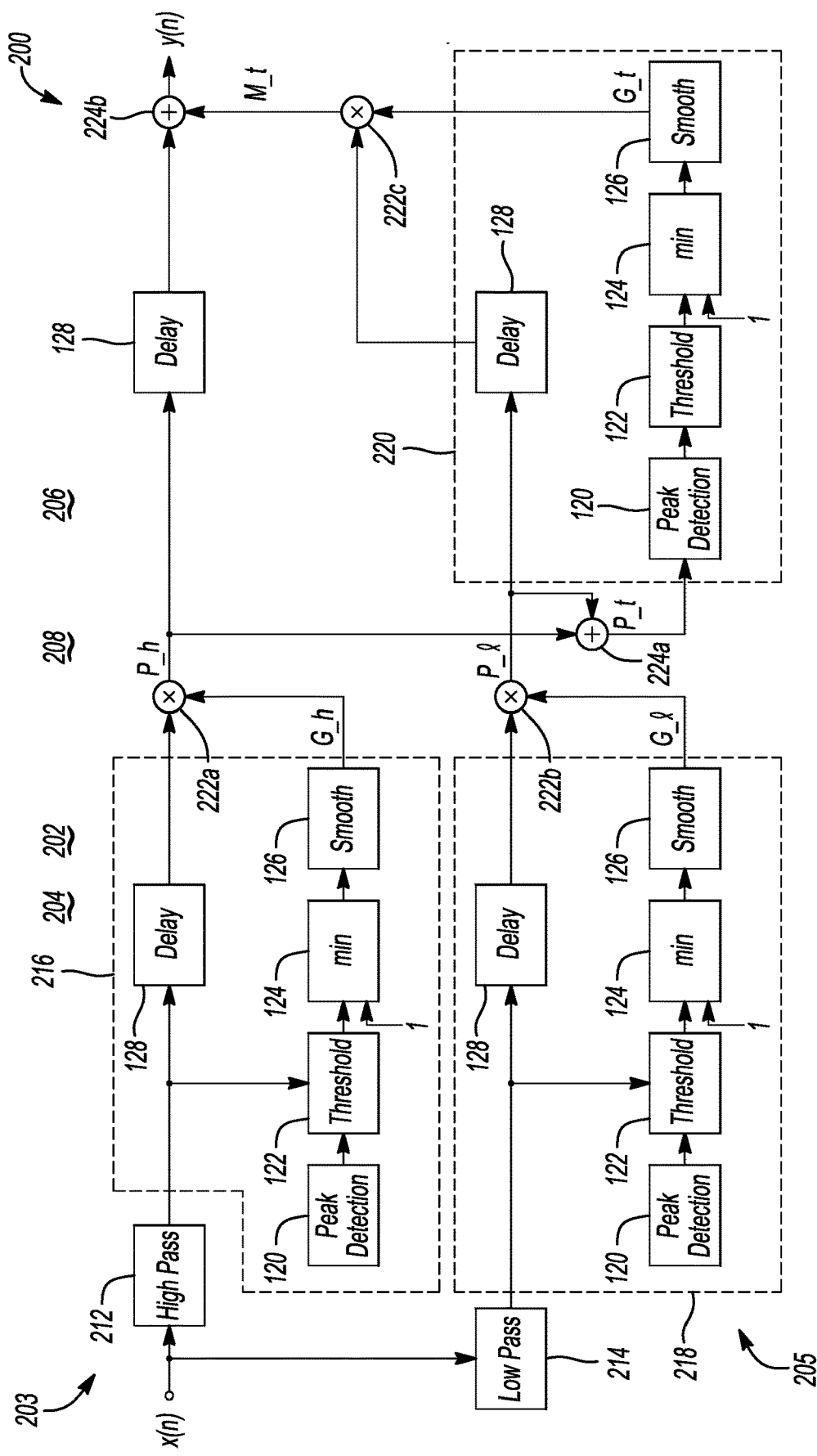
FIG. 4 depicts a more detailed view of the limiter of FIG. 3 in accordance with one embodiment.

FIG. 4 depicts a more detailed view of the audio limiter system 200 of FIG. 3 in accordance with one embodiment. As shown, the first limiter threshold block 216 includes the peak detection block 120, the first threshold block 122, the minimum block 124, the smoothing block 126, and the delay block 128. Similarly, the second limiter threshold block 218 includes the peak detection block 120, the first threshold block 122, the minimum block 124, the smoothing block 126, and the delay block 128. In addition, the third limiter threshold block 220 includes the peak detection block 120, the first threshold block 122, the minimum block 124, the smoothing block 126, and the delay block 128.

In operation on the high frequency side limiter 203, the incoming audio signal is passed through the first filter 212 where frequency components that are above the cutoff frequency of the first filter 212 are passed to the peak detection block 120. The peak detection block 120 obtains the peak magnitude of the audio input signal for frequencies that are above the cutoff frequency and provides an output indicative of this value to the first threshold block 122. The first threshold block 122 compares the peak magnitude of the audio input signal for every time frame to the high threshold value. If the peak magnitude of the audio input signal on the high frequency side limiter 203 is greater than the high threshold value, then first threshold block 122 outputs the high threshold value to the minimum block 124 which serves to limit the incoming audio signals with the high frequencies. In one example, the first threshold block 122 may utilize the following $$x_{out}(x_{in}) = \begin{cases} x_{in} & x_{in} < T \\ T & x_{in} \geq T \end{cases}$$

where T is the threshold (i.e., the high threshold value for the first limiter threshold block 216, the low threshold value for the second limiter threshold block 218, or the total threshold value for the third limiter threshold block 220), $x_{in}$ corresponds to the incoming audio signal, and $x_{out}$ corresponds to the output of the first threshold block 122.

The minimum block 124 takes the minimum value of the output of the first limiter threshold block 216 and a predetermined constant (e.g., 1). Thus, if output of the first threshold block 122 is smaller than the predetermined constant, then the high frequency side limiter 203 limits the gain of the incoming audio signal to this value. If on the other hand the predetermined constant is smaller than or less than output of the first threshold block 122, then the high frequency side limiter 203 limits the gain of the incoming audio signal to this value. The delay block 128 time aligns (or delays) the incoming audio signal to reach the multiplier circuit 222*a* at approximately the same time as the output from the smoothing block 126 (e.g., the first gain compression output signal G_h). The smoothing block 126 aids in mitigating an abrupt change of the output provided by the first threshold block 122. For example, the smoothing block 126 performs the smooth processing operation by utilizing, for example, a first-order lowpass filter on the output provided by the first threshold block 122. For example, for each time frame of the incoming audio signal, the first threshold block 122 may output [0.5, 1, 0.1, 0.9, 0.01 . . . ] and then the smoothing block 126 may output [0.22, 0.68, 0.57, 0.51, 0.46].

The multiplier circuit 222*a* multiplies the first gain compression output signal G_h to the delayed incoming audio signal and limits the gain of the high frequency components in accordance to the limit established by the first gain compression output gain signal G_h to provide the first high audio output signal, P_h.

Similarly, the peak detection block 120, the first threshold block 122, the minimum block 124, the smoothing block 126, and the delay block 128 of the second limiter threshold block 218 operate in a similar manner to that described above in connection with the first limiter threshold block 216 with the exception of such blocks 120, 122, 124, 126, and 128 operating on frequencies on the incoming audio signal that are below the cutoff frequency of the low pass filter 214. The multiplier circuit 222*b* multiplies the second gain compression output signal G_1 to the incoming audio signal and limits the gain of the low frequency components in accordance to the limit established by the second gain compression output gain signal G_1 to provide the first low audio output signal, P_1.

Similarly, the peak detection block 120, the first threshold block 122, the minimum block 124, the smoothing block 126, and the delay block 128 of the third limiter threshold block 220 operate in a similar manner to that described above in connection with the first and the second limiter threshold blocks 216, 218. As shown, the adder circuit 224 adds the first high audio output signal P_h to the first low gain output signal P_1 and limits the gain of this summed signal. The multiplier circuit 222*c* multiplies the total gain compression output signal G_t to the first low audio output signal P_1 and limits the gain of the first low gain output signal P_1 in accordance with the limit established by the total gain compression output gain signal G_t to provide a first low/high audio output signal, P_2. The delay block 128 delays the first high audio output signal P_h which is then received at the adder circuit 224*b*. The delay block 128 time aligns the first thigh audio output signal P_h with the total gain compression output gain signal G_t and the adder circuit 224*b* adds both signals together to provide the output audio signal.

Figure 5:
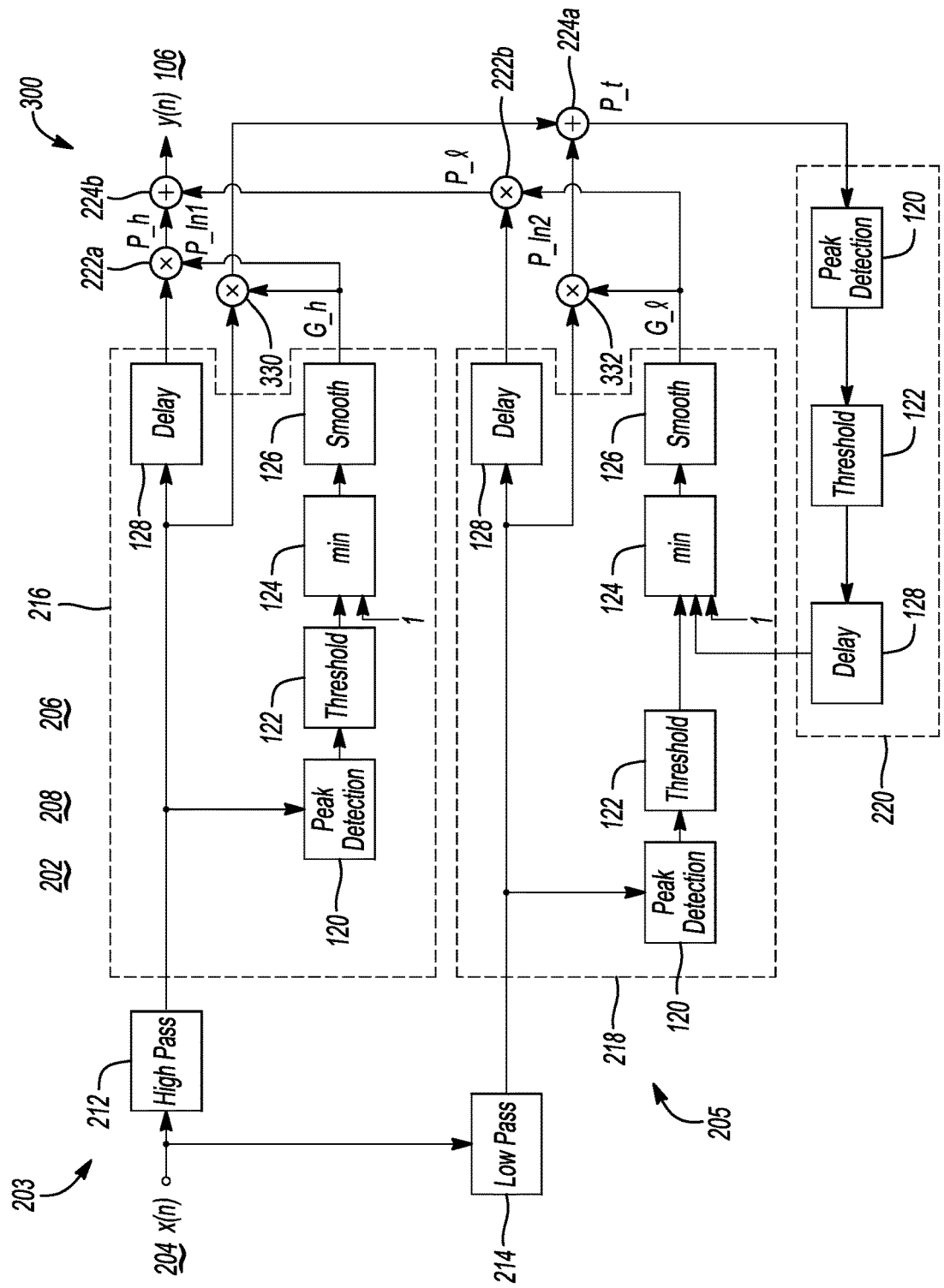
FIG. 5 depicts a detailed view of the limiter in accordance with one embodiment.

FIG. 5 depicts another detailed view of a limiter 300 (or audio limiter system 300) in accordance with one embodiment. The audio limiter system 300 of FIG. 5 includes the high frequency side limiter 203 and the low frequency side limiter 205. The high frequency side limiter 203 includes the first limiter threshold block 216 which includes the peak detection block 120, the threshold block 122, the minimum block 124, the smooth block 126, and the delay block 128. The operations of the peak detection block 120, the first threshold block 122, the minimum block 124, and the delay block 128 are similar to that described above. The limiter 300 includes a multiplier circuit 330 that multiplies the first gain compression output G_h to the incoming audio signal with the high frequency components to generate an intermediate high output signal P_I$_{n1}$ without a delay or latency being introduced by the delay block 128. This condition may reduce the latency and the audio limiter system 300 may be in a position to analyze the total energy of the incoming audio signal (or total audio output signal, P_t) in advance or at a quicker rate. In addition, the multiplier circuit 222*a* multiplies the first gain compression output G_h to the output of the delay block 128 to generate the first high audio output signal P_h.

The low frequency side limiter 205 includes the second limiter threshold block 218. The second limiter threshold block 218 includes the peak detection block 120, the threshold block 122, the minimum block 124, the smooth block 126, and the delay block 128. The operations of the peak detection block 120, the first threshold block 122, the minimum block 124, and the delay block 128 are similar to that described above. The limiter 300 includes a multiplier circuit 332 that multiplies the second gain compression output G_1 to the incoming audio signal with the low frequency components to generate an intermediate low output signal to generate an intermediate low output signal P_I$_{n2}$ without a delay or latency being introduced by the delay block 128. As noted above, this condition may reduce the latency and the audio limiter system 300 may be in a position to analyze the total energy of the incoming audio signal (or total audio output signal, P_t) in advance or at a quicker rate. In addition, the multiplier circuit 222b multiplies the second gain compression output G_1 to the output of the delay block 128 to generate the first low audio output signal P_1. The adder circuit 224a adds the intermediate high output signal P_I$_{n1}$ to the intermediate low output signal P_I$_{n2}$ to generate the total audio output signal P_t. The third limiter threshold block 220 includes the peak detection block 120, the threshold block 122, and the delay block 128. The operations performed by the peak detection block 120, the threshold block 122, and the delay block are similar to that described above. The delay block 128 of the third limiter threshold block 220 provides an output to the minimum circuit 324 of the second limiter threshold block 218. The minimum block 124 takes the minimum of the input signals (e.g., from the output of the threshold block 122, an output of the delay block 128 of the third limiter threshold block 220, and a predetermined constant) it receives and provides an output to the smoothing block 126. The minimum block 124 generally compares the output of the first threshold block 122 to the low band energy and to the total energy band and further to the predetermined constant and selects the minimum thereof. The smoothing block 126 provides the second gain compression output signal G_1 to the multiplier circuit 222b. The multiplier circuit 332 multiplies the second gain compression output signal G_1 to low frequency components on the incoming audio signal to generate the first low audio output signal P_1. The adder circuit 224b adds the first high audio output signal P_h to the second low audio output signal P_1 to generate the output audio signal, y(n). The limiter 300 as shown in connection with FIG. 5 provides the same functionality as offered by the limiter 200 of FIGS. 3 and 4. In short, the limiters 200 and 300 check the total energy (e.g., both the high frequency and low frequency) and compress the low-band energy-based audio output if the total energy on both the high side and low side frequencies of the incoming audio signal is too high.

Figure 6:
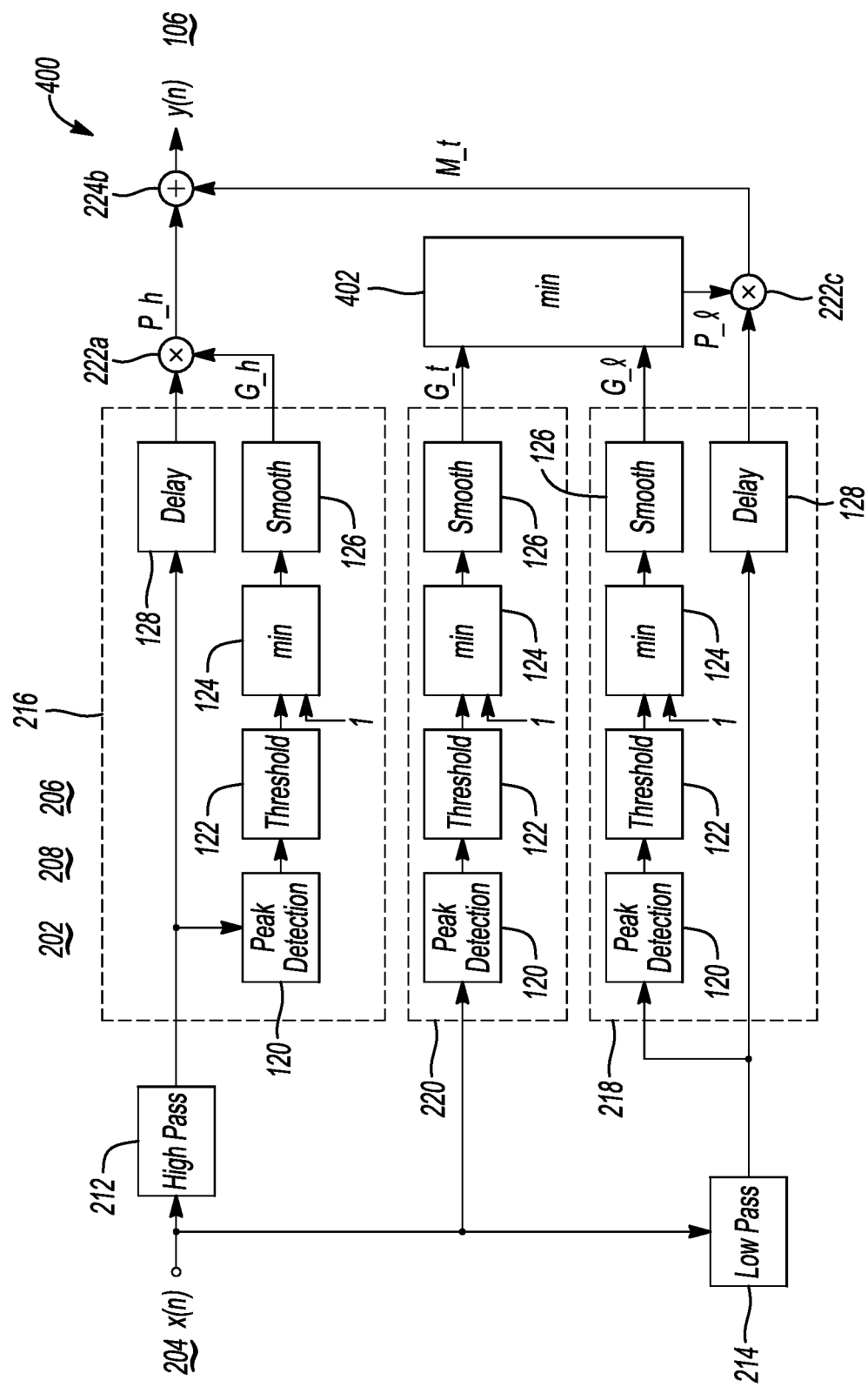
FIG. 6 depicts another detailed view of the limiter in accordance with one embodiment.

FIG. 6 depicts an audio limiter system 400 (or the limiter 400) in accordance with another embodiment. The limiter 400 includes the first filter 212 (e.g., high pass filter), the second filter 214 (e.g., low pass filter), the first limiter threshold block 216, the second limiter threshold block 218, the third limiter threshold block 220, the multiplier circuits 222a-222b, the adder circuit 224b and a minimum block 402. Each of the first, second and third limiter threshold blocks 216, 218 and 220 includes the peak detection block 120, the threshold block 122, the minimum block 124, and the smoothing block 126. The functionality for each of the blocks 120, 122, 124 and 126 is similar to that noted above. The minimum block 402 takes the minimum gain between the output of the second limiter threshold block 218 and the third limiter threshold block 220 and provides the minimum between the two blocks 218 and 220 to the multiplier circuit 222c. The multiplier circuit 222c multiplies the minimum gain between the output of the second limiter threshold block 218 and the third limiter threshold block 220 to the low pass filtered incoming audio signal to provide an output that is summed to the output of the first limiter threshold block 216 to provide the audio output signal to the loudspeaker 106. It is recognized that the limiter 400 may satisfy the three conditions as set forth above in connection with the limiter 200 of FIG. 3. The minimum block 402 receives the second gain compensation output signal G_1 from the smooth block 126 of the second limiter threshold block 218 and the total gain compensation signal G_t from the third limiter threshold block 220. The minimum block 402 takes the minimum value between the receives the second gain compensation output signal G_1 and the total gain compensation signal G_t and provides this as the first audio output signal P_1 to the multiplier circuit 222c. In general, when the high frequency energy is low and the low frequency energy is high (e.g., the second gain compensation output signal G_1 is less than or equal to the total gain compensation signal, G_t), the low frequency side limiter 205 reduces low frequency distortion with the second gain compensation signal G_1. When both low and high frequency energies are high (e.g., the second gain compensation output signal G_1 is greater than the total gain compensation signal G_t, the audio limiter system 400 reduces the total distortion by decreasing the low band energy with the total gain compensation signal G_t.

The multiplier circuit 222c multiplies the delayed input audio signal with the low frequency components (e.g., from the delay block 128) to the first audio output signal P_1. Thus, the delayed incoming audio signal with the low frequency components are limited to the lower of the gain thresholds as set forth in the threshold blocks 122 of the second and the third limiter threshold blocks 218 and 220. The multiplier circuit 222c provide the outputs of the product of the delayed input audio signal with the low frequency components (e.g., from the delay block 128) and the first audio output signal P_1 to the adder circuit 224b where the adder circuit 224 adds this signal to the first high audio output signal P_h which then provides the audio output signal y(n). The limiter 400 also checks the total energy (e.g., both the high frequency and low frequency) and compresses the low-band energy-based audio output in response to the total energy on both the high and low frequencies of the incoming audio signal being too high.

FIG. 7 depicts a tuning process 500 of one or more of the audio limiter systems 200, 400 in accordance with one embodiment. The crossover frequency for the first filter 212 and the second filter 214 may be set to, for example, 300 Hz. In this instance, the high pass filter 212 may allow frequencies on the incoming audio signal that are above 300 Hz to pass downstream through the limiter 200, 300, and/or 400. In addition, the low pass filter 214 may allow frequencies on the incoming audio signal that are below 300 Hz to pass downstream through the limiter 200, 300 and/or 400. In one example, the high gain threshold for the first limiter threshold block 216 of the high frequency side limiter 203 may be a gain of, for example, −26 dB. Similarly, the low gain threshold for the second limiter threshold block 218 of the low frequency side limiter 205 may be −26 b may be a gain of, for example, −26 dB. The predetermined threshold value (or gain threshold) for the third limiter threshold block 220 may be, for example, −18 dB.

In addition, the attack and release time for the peak detection block 320 for the high frequency side limiter 203 may be 10 ms and 10000 ms, respectively. In addition, the attack and release time for the peak detection block 320' for the low frequency side limiter 205 may be 10 ms and 10000 ms, respectively. Finally, the attack and release time for peak detection block 320' for the third limiter threshold block 220 may be 10 ms and 1000 ms, respectively.

Figure 8:
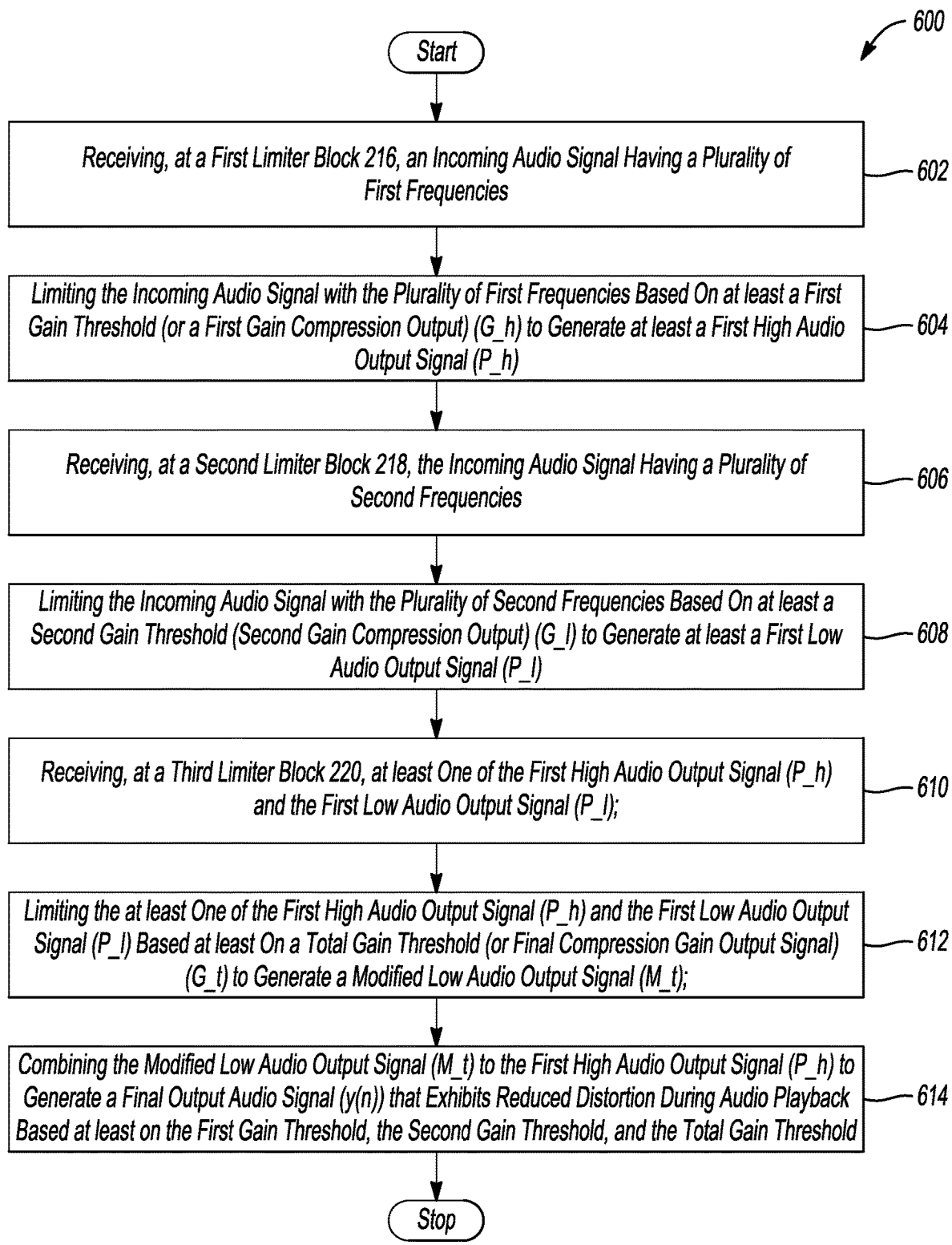
FIG. 8 depicts a method for limiting an incoming audio signal in accordance with one embodiment.

FIG. 8 depicts a method 600 for limiting an incoming audio signal in accordance with one embodiment. The method 600 may be executed by one or more of the limiter systems 200, 300, and 400 to, among other things, check the total energy (e.g., both the high frequency and low frequency) and compress the low-band energy-based audio output if the total energy on both the high and low frequencies of the incoming audio signal is too high.

In operation 602, the first limiter block 216 (or the first limiter threshold block 216) receives the incoming audio signal including a plurality of first frequencies (e.g., high frequencies that are above the cutoff frequency).

In operation 604, the first limiter block 216 limit the incoming audio signal with the plurality of first frequencies based on at least a first gain threshold (or the first gain compression output, G_h) to generate at least the first high audio output signal (P_h).

In operation 606, the second limiter block 218 (or the second limiter threshold block 218) receives the incoming audio signal having a plurality of second frequencies (e.g., low frequencies that are below the cutoff frequency).

In operation 608, the second limiter block 218 limits the incoming audio signal with the plurality of second frequencies based on at least a second gain threshold to generate at least the first low audio output signal (P_1).

In operation 610, the third limiter block 220 (or the third limiter threshold block 220) receives at least one of the first high audio output signal (P_h) and the first low audio output signal (P_1).

In operation 612, the third limiter block 220 limits the at least one of the first high audio output signal (P_h) and the first low audio output signal (P_1) based at least on the total gain threshold (or the final compression gain output signal G_t) to generate the modified low audio output signal (M_t).

In operation 614, the adder circuit 224b combines the modified low audio output signal (M_t) to the first high audio output signal (P_h) to generate a final output audio signal (or output audio signal) (y(n)) that exhibits reduced distortion during audio playback based at least on the first gain threshold, the second gain threshold, and the total gain threshold.

It is recognized that the controllers as disclosed herein may include various microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, such controllers as disclosed utilizes one or more microprocessors to execute a computer-program that is embodied in a non-transitory computer readable medium that is programmed to perform any number of the functions as disclosed. Further, the controller(s) as provided herein includes a housing and the various number of microprocessors, integrated circuits, and memory devices ((e.g., FLASH, random access memory (RAM), read only memory (ROM), electrically programmable read only memory (EPROM), electrically erasable programmable read only memory (EEPROM)) positioned within the housing. The controller(s) as disclosed also include hardware-based inputs and outputs for receiving and transmitting data, respectively from and to other hardware-based devices as discussed herein.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An audio limiter system comprising:
a first limiter block programmed to receive an incoming audio signal having a plurality of first frequencies and to limit the incoming audio signal with the plurality of first frequencies based on at least a first gain threshold to generate at least a first high audio output signal;
a second limiter block programmed to receive the incoming audio signal having a plurality of second frequencies and to limit the incoming audio signal with the plurality of second frequencies based on at least a second gain threshold to generate at least a first low audio output signal;
a third limiter block programmed to receive at least one of the first high audio output signal and the first low audio output signal and to limit the at least one of the first high audio output signal and the first low audio output signal based at least on a total gain threshold to generate a modified low audio output signal; and
an adder circuit programmed to combine the modified low audio output signal to the first high audio output signal to generate a final output audio signal that exhibits reduced distortion during audio playback based at least on the first gain threshold, the second gain threshold, and the total gain threshold.

2. The audio limiter system of claim 1 further including a first multiplier circuit programmed to multiply a first gain compression output to the incoming audio signal with the plurality of first frequencies to generate the first high audio output signal.

3. The audio limiter system of claim 2 further including a delay block programmed to time delay the first high audio output signal prior to the adder circuit combining the modified low audio output signal to the first high audio output signal to generate the final output audio signal.

4. The audio limiter system of claim 1 further including a first multiplier circuit programmed to multiply a second gain compression output to the incoming audio signal with the plurality of second frequencies to generate the first low audio output signal.

5. The audio limiter system of claim 4 further comprising a first adder circuit programmed to combine the first high audio output signal with the first low audio output signal to generate a total audio output signal.

6. The audio limiter system of claim 5, wherein the third limiter block is further programmed to limit the total audio output signal based on the total gain threshold to reduce distortion during the audio playback of the incoming audio signal for the plurality of first frequencies and the plurality of second frequencies.

7. The audio limiter system of claim 6 further comprising a second multiplier programmed to multiply a final compression gain output to the first low audio output signal to generate the modified low audio output signal.

8. The audio limiter system of claim 1 further comprising:
a first filter programmed to filter the incoming audio signal to provide the plurality of first frequencies; and
a second filter programmed to filter the incoming audio signal to provide the plurality of second frequencies,
wherein the plurality of first frequencies is greater than the plurality of second frequencies.

9. A method for limiting an audio signal, the method comprising:
receiving, at a first limiter block, an incoming audio signal having a plurality of first frequencies;
limiting the incoming audio signal with the plurality of first frequencies based on at least a first gain threshold to generate at least a first high audio output signal;

receiving, at a second limiter block, the incoming audio signal having a plurality of second frequencies;

limiting the incoming audio signal with the plurality of second frequencies based on at least a second gain threshold to generate at least a first low audio output signal;

receiving, at a third limiter block, at least one of the first high audio output signal and the first low audio output signal;

limiting the at least one of the first high audio output signal and the first low audio output signal based at least on a total gain threshold to generate a modified low audio output signal; and combining the modified low audio output signal to the first high audio output signal to generate a final output audio signal that exhibits reduced distortion during audio playback based at least on the first gain threshold, the second gain threshold, and the total gain threshold.

10. The method of claim 9 further comprising multiplying a first gain compression output to the incoming audio signal with the plurality of first frequencies to generate the first high audio output signal.

11. The method of claim 10 further comprising time delaying the first high audio output signal prior to combining the modified low audio output signal to the first high audio output signal to generate the final output audio signal.

12. The method of claim 9 further comprising multiplying a second gain compression output to the incoming audio signal with the plurality of second frequencies to generate the first low audio output signal.

13. The method of claim 12 further comprising combining the first high audio output signal with the first low audio output signal to generate a total audio output signal.

14. The method of claim 13 further comprising limiting the total audio output signal based on the total gain threshold to reduce distortion during the audio playback of the incoming audio signal for the plurality of first frequencies and the plurality of second frequencies.

15. The method of claim 14 further comprising multiplying a final compression gain output to the first low audio output signal to generate the modified low audio output signal.

16. The method of claim 9 further comprising:

filtering, via a first filter, the incoming audio signal to provide the plurality of first frequencies; and filtering, via a second filter, the incoming audio signal to provide the plurality of second frequencies, wherein the plurality of first frequencies is greater than the plurality of second frequencies.

17. A computer-program product embodied in a non-transitory computer readable medium stored in memory and executable by at least one controller to limit an audio signal, the computer-program product comprising instructions for:

receiving, at a first limiter block, an incoming audio signal having a plurality of first frequencies;

limiting the incoming audio signal with the plurality of first frequencies based on at least a first gain threshold to generate at least a first high audio output signal;

receiving, at a second limiter block, the incoming audio signal having a plurality of second frequencies;

limiting the incoming audio signal with the plurality of second frequencies based on at least a second gain threshold to generate at least a first low audio output signal;

receiving, at a third limiter block, at least one of the first high audio output signal and the first low audio output signal;

limiting the at least one of the first high audio output signal and the first low audio output signal based at least on a total gain threshold to generate a modified low audio output signal; and combining the modified low audio output signal to the first high audio output signal to generate a final output audio signal that exhibits reduced distortion during audio playback based at least on the first gain threshold, the second gain threshold, and the total gain threshold.

18. The computer-program product of claim 17 further comprising multiplying a first gain compression output to the incoming audio signal with the plurality of first frequencies to generate the first high audio output signal.

19. The computer-program product of claim 18 further comprising time delaying the first high audio output signal prior to combining the modified low audio output signal to the first high audio output signal to generate the final output audio signal.

20. The computer-program product of claim 19 further comprising multiplying a second gain compression output to the incoming audio signal with the plurality of second frequencies to generate the first low audio output signal.

* * * * *